United States Patent [19]

Yamada et al.

[11] 4,168,916
[45] Sep. 25, 1979

[54] ULTRASONIC OSCILLATOR DEVICE AND MACHINE INCORPORATING THE DEVICE

[75] Inventors: Shohachi Yamada, Machida; Akira Nishi, Yokohama; Kouichi Mishima; Youichiro Akanuma, both of Tokyo, all of Japan

[73] Assignee: Stanley Electric Co., Ltd., Tokyo, Japan

[21] Appl. No.: 889,741

[22] Filed: Mar. 24, 1978

[51] Int. Cl.² .......................................... B01F 11/00
[52] U.S. Cl. .................................... 366/116; 331/187
[58] Field of Search .............................. 366/108–112, 366/116; 331/52, 154, 155, 177 R, 182, 187

[56] References Cited

U.S. PATENT DOCUMENTS

| 3,771,772 | 11/1973 | Honda | 366/110 |
| 3,826,993 | 7/1974 | White | 331/154 X |

Primary Examiner—Leonard D. Christian
Attorney, Agent, or Firm—Frishauf, Holtz, Goodman and Woodward

[57] ABSTRACT

An ultrasonic oscillator device which has automatic gain control and which comprises a phase detector for detecting the phase difference between a load voltage and varying quantities indicating an operational condition of the load. The device further comprises a voltage control oscillator adapted to control an oscillating frequency through a direct current voltage corresponding to the phase difference. Further, the ultrasonic oscillator device is combined with a vibrator driven thereby and a small sized motor having a fan to forcedly cool the vibrator. The vibrator and the fan are accommodated in a housing, the size of which is made small, to produce a compact type machine.

14 Claims, 5 Drawing Figures

ULTRASONIC OSCILLATOR DEVICE AND MACHINE INCORPORATING THE DEVICE

BACKGROUND OF THE INVENTION

The present invention relates to an ultrasonic oscillator device and more particularly to an ultrasonic oscillator device for driving a vibrating system such as a machine utilizing ultrasonic waves.

Description of the Prior Art

In ultrasonic machine tools and ultrasonic welders, a vibrator is connected with a device for magnifying the vibrating amplitude to efficiently utilize ultrasonic waves. Further, in such a vibrating system, there is used a vibration feedback oscillator in which the oscillating frequency thereof is adapted to automatically follow to a resonance frequency of the vibrating system in order to drive the latter.

In such a vibration feed back oscillator, the feedback is set to be large and the amplitude is limited by means of an amplitude limiting circuit. However, in such a structure, when the load is large, the oscillation often stops because the quantity of feed back reduces.

In such a prior art structure, a band-pass filter is used to avoid oscillation occurring from higher harmonics of the oscillator. The filter has defect that its frequency following capacity is reduced when the frequency selectivity is sharpened. Such defects are pronounced in the case where the oscillator is set to oscillate by a very small quantity of feed back.

Further, in such a prior art structure an adjustment of the frequency is very difficult since the resonant frequency of the band-pass filter is used in common with the resonant frequency of the vibrating system.

In addition, the prior art structure has a defect that the oscillation does not occur immediately after putting on the power source under a special condition that a load exists already when putting on the power source.

Furthermore, in the prior art vibration feed-back oscillator combined with an ultrasonic machine tool, an inconvenience is caused due to the fact that a natural vibrating frequency of a tool to be interchanged must be set to meet with the resonance frequency of the vibrating system.

In a prior art ultrasonic machine tool including a vibration feed-back oscillator, a vibrator is accommodated in a housing of synthetic resin entirely with a horn setting a tool such as grindstone, cutter or the like on its leading end, by means of screw or the like. In such a machine tool because high temperature occurs from the vibrator and the tool during working, the current fed to the vibrator must be held to a fixed value. Accordingly, the prior art machine tool cannot have its increased power and the continuous working time is limited due to the adverse influence of the high temperature.

OBJECTS OF THE INVENTION

Accordingly, it is an object of the present invention to eliminate the various defects in the prior vibration feedback oscillator mentioned above.

It is another object of the invention to provide an ultrasonic oscillator device which can be positively driven by a resonance frequency of a load and which has an excellent capacity for following the resonance frequency.

It is a further object of the invention to provide an ultrasonic oscillator device in which the oscillating operation is stable and its starting is sure.

It is a still further object of the invention to provide an ultrasonic oscillator device in which the oscillation does not stop at a heavy load and the circuit does not include any element having a resonance characteristic except the load.

It is another object of the invention to provide an ultrasonic oscillating device in which, when it is combined with an ultrasonic machine tool, the circuit can be easily operated even if the resonance frequency were varied by the exchange of the tool.

It is a further object of the invention to provide an ultrasonic machine tool which can have its power increased and which is fit for use for a long time without overheating.

SUMMARY OF THE INVENTION

According to one aspect of the invention, an ultrasonic oscillating device comprises a phase detector for detecting the phase difference between a load voltage and varying quantities indicating an operational condition of the load, and a voltage control oscillator adapted to control an oscillating frequency responsive to a direct current voltage corresponding to the phase difference.

According to another aspect of the invention, an ultrasonic machine tool comprises a housing which accommodates a vibrator therein and which has a plurality of air inlet bores at proper positions thereof, and a small-sized motor which is disposed above the vibrator in the housing and which has a fan mounted on a rotating shaft thereof.

The above and other objects and features of the invention will become apparent from the following description taken with reference to the accompanying drawings.

DETAILED DESCRIPTION OF PREFERRED EMBODIMENT OF THE INVENTION

Figure 1:
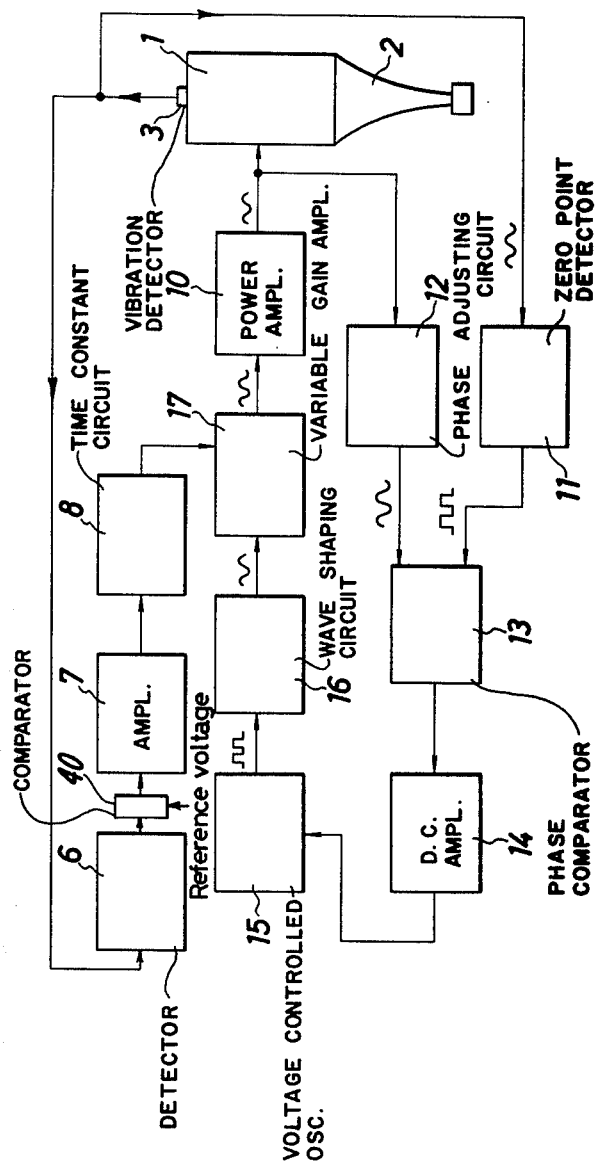
FIG. 1 is a block diagram showing one embodiment of an ultrasonic oscillator device according to the present invention.

Referring to FIG. 1, an ultrasonic oscillating device and a vibrator 1 is connected to a horn 2 to form a vibrating system. On one portion of the vibrating system, for example, on the vibrator 1 is adhered a vibration detector 3 from which an output (motional voltage) is obtained proportionally to a vibrating speed. The output of vibration detector 3 is rectified in a detector circuit 6 and thereafter is compared with a reference voltage in comparator 40. The obtained difference voltage is applied through the intermediary of an amplifier 7 and a time constant circuit 8 to a variable gain amplifier 17 to perform a kind of rectified negative feed back.

Such a structure is substantially similar to that of the well known vibration feed back oscillator.

In accordance with the present invention, the output of the vibration detector 3 is also applied to a zero point detecting circuit 11 so as to obtain a rectangular wave. The rectangular wave output of the zero point detecting circuit 11 is applied to a phase comparator circuit 13 wherein it is compared with a driving voltage of the vibrator 1 which has been phase adjusted in a phase adjusting circuit 12. The output of phase comparator 13 is a direct current voltage corresponding to the difference signal. The obtained voltage is amplified in a direct current amplifier 14 and is used to control the oscillating frequency of a voltage controlled oscillator 15. Oscillator 15 produces a rectangular wave output which is wave shaped to a sinusoidal wave by a wave shaping circuit 16 and thereafter is applied to and amplified by the variable gain amplifier 17. The output of amplifier 17 is further amplified by a power amplifier 10 so as to be useful as a driving voltage of the vibrator 1.

Figure 2:
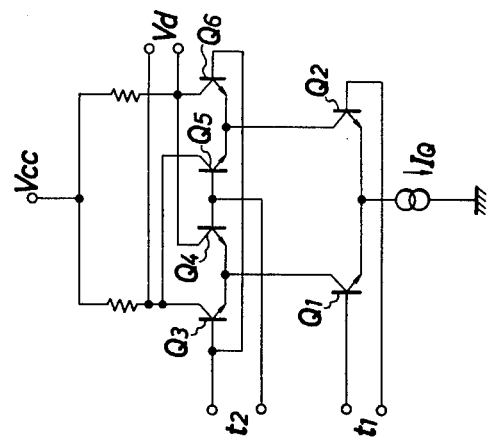
FIG. 2 is a circuit diagram showing a phase comparator circuit.
Figure 3:
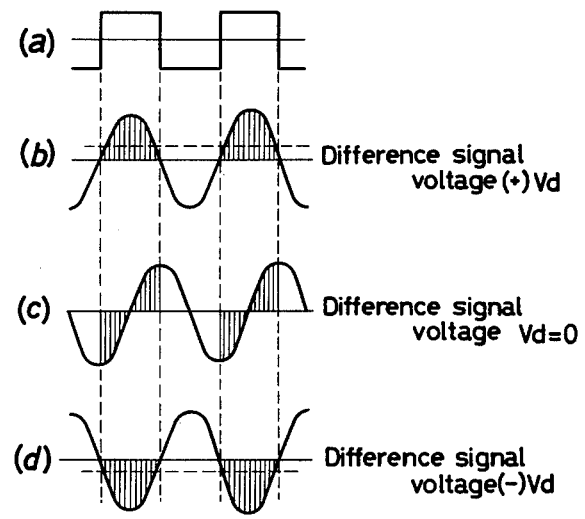
FIGS. 3(a)-(d) is a wave form chart explaining the operation of the phase comparator circuit.

As a phase comparator circuit 13, one can use any circuit of the discriminator type, double balanced product detector type, double balanced chopper type, digital type or the like. Herein described is a circuit of the double balanced product type. As shown in FIG. 2, a sinusoidal wave which is the output of the phase adjusting circuit 12 is applied to a terminal $t_1$ which supplies a signal to the bases of transistors $Q_1$ and $Q_2$ so as to control a balance of a bias current $I_Q$ of the transistors $Q_1$ and $Q_2$. A rectangular wave which is the output of the zero point detector circuit 11 is applied to a terminal $t_2$ so as to operate a switching circuit constituted by transistors $Q_3$, $Q_4$, $Q_5$ and $Q_6$. If the sinusoidal wave signal has the phase relations as shown in FIGS. 3(b), 3(c) and 3(d) in relation to the rectangular wave signal of FIG. 3(a), the difference signal voltage Vd ( a mean value of the output wave form) has its positive maximum value at the phase difference 0° as in FIG. 3(b), zero at the phase difference 90° as in FIG. 3(c), and its negative maximum value at the phase difference 180° as in FIG. 3(d).

The voltage controlled oscillator 15 for producing the oscillation of sinusoidal wave or rectangular wave has an input terminal for a direct current signal whereby the oscillating frequency can be varied according to the increase and decrease of the direct current signal. The oscillator 15 may be any circuit of the Schmidt trigger type, emitter connecting multivibrator type, type utilizing a variable resistance characteristic of a field effect transistor, type utilizing a varactor or the like.

Figure 4:
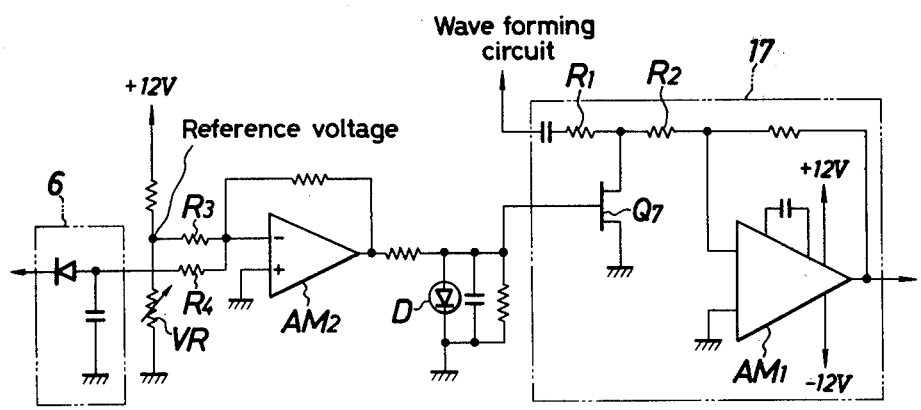
FIG. 4 is a circuit diagram showing an amplifier having a variable degree of amplification and FIG. 5 is a partially cross-sectional view showing a support device for a vibrator and a tool of an ultrasonic machine tool according to the invention.

The variable gain amplifier 17 which acts to keep the amplitude constant regardless of the load may be implemented as shown in FIG. 4 that a field effect transistor (FET) $Q_7$ is connected with an input end of the amplifier $AM_1$ while an input signal of relatively low voltage is applied between the drain-source of the FET. A voltage applied to the gate of the FET is obtained from an operational amplifier $AM_2$ as a difference voltage between a detecting output from the detector circuit 6 and the reference voltage. This circuit is a so-called variable attenuator circuit utilizing the variable resistance characteristic of the FET. Considering that the circuit has a wide controlling width at a signal as large as possible, resistors $R_1$ and $R_2$ for connecting with the drain of the FET $Q_7$ are preferably selected as $R_1 = 47$ kΩ and $R_2 = 2.2$ kΩ.

In FIG. 1 the driving voltage 19, through phase adjusting circuit 12 is one input of the phase comparator circuit 13. The phase adjusting circuit is provided because the phases between the applied voltage 19 and the output of the vibration detector 3 are equal to each another if the vibrator 1 is driven at its natural vibrating frequency. Either one of the input signals which are fed to the inputs of phase comparator 13 must have a phase difference of 90° relative to the other one, the phase difference of 90° being the reference phase (as a center of the control range) in the phase comparator circuit 13. However, in practice, since the signal is fed out from the input of the power amplifier 10, a phase delay occurs from the power amplifier 10 and an output transformer thereof. This phase delay becomes about 90° and therefore it is not necessary to provide additional means for adjusting phase. The detection of vibration at the vibrator 1 can be performed by a resistor for detecting current connected with the vibrator 1 so as to detect the current flow in the vibrator, instead of an electric strain element. In this case, since the signal is subjected to the influence of damped admittance of the vibrator 1, the circuit must insure that the equivalent impedance of the vibrator is only the component of pure resistance at resonance, for example, by connecting in parallel to the vibrator an inductance which resonates with the damped admittance at the resonant frequency.

In operation of the above described oscillator device, the vibrator 1 vibrates by applying the driving voltage 19 to the vibrator. The vibration is detected by the vibration detector 3. The detected signal is supplied to the detector circuit 6 and the zero point detecting circuit 11 and is converted into rectangular wave in the zero point detecting circuit 11. The rectangular wave signal is supplied to the phase comparator circuit 13 together with the driving voltage. The phases of both signals are compared in the phase comparator circuit 13 and consequently a direct current voltage is produced which is a function of the difference between the phases. In this operation, as shown in FIGS. 3(a)-3(d), at the phase difference of 90° a difference signal voltage Vd becomes zero and it constitutes a center of the control range, the voltage value being increased according to the phase difference at front and rear range. The voltage Vd is amplified by the direct current amplifier 14 and is supplied to the voltage controlled oscillator 15. At the oscillator 15 the output frequency changes into a value defined by the direct current input, the output thereof being a rectangular output of its frequency of its frequency. The rectangular output is wave shaped at the wave shaping circuit 16 and becomes an input signal of the variable gain amplifier 17. The input signal (alternating current signal) changes according to the gate voltage of the FET $Q_7$ (FIG. 4) in the variable attenuator circuit which is constituted by resistors $R_1$ and $R_2$ of the input side of the amplifier $AM_1$ and the FET $Q_7$. The signal is amplified by the amplifier $AM_1$ and the power amplifier 10 and is applied to the vibrator 1. By this, the vibrator 1 vibrates at the natural vibrating frequency. The detecting output of the detector circuit 6 is passed into the operational amplifier $AM_2$ so as to compute the difference between it and the reference voltage set by the variable resistor VR and the obtained difference voltage becomes a gate voltage. That is, since the operational amplifier $AM_2$ is grounded at the + terminal and the reference voltage of positive polarity is applied to the − terminal through a resistor $R_3$, if the detection input does not exist the output of the operational amplifier $AM_2$ becomes the − and the portion exceeding the Zener voltage of a Zener diode D is cut off whereby the FET $Q_7$ becomes non-conducting since the negative (−) voltage is applied to the gate and the alternating current signal becomes an output according to the amplification degree of the amplifier $AM_1$.

If the output of the vibrating detector 3 becomes large, the half-wave of the negative (−) direction is applied to the − input end of the operational amplifier $AM_2$ through a resistor $R_4$. Since the input is a value adding the reference voltage of + and the detecting voltage of −, the output of the operational amplifier AM becomes close to ground potential when the detecting input does not exist and therefore the resistance value of the FET $Q_7$ is thereby reduced, also reducing the amplification degree of the variable gain amplifier 17. Accordingly, if the reference voltage is properly set, the vibrator 1 vibrates always with the amplitude according to the reference voltage regardless of the load.

The ultrasonic oscillating device mentioned above can fully eliminate the defects in the prior vibrating feed back oscillator so as to attain the objects of the present invention. However, in order to obtain high efficiency by incorporating the oscillator in the ultrasonic machine tool, it is necessary to improve a portion of the tool which accommodates and supports the vibrator, the horn and the tool. That is, as memtioned previously, because the vibrator and the tool generate high temperature during working, the machine tool can not pass more current than the fixed value into the vibrator and further its working time is limited.

Figure 5:
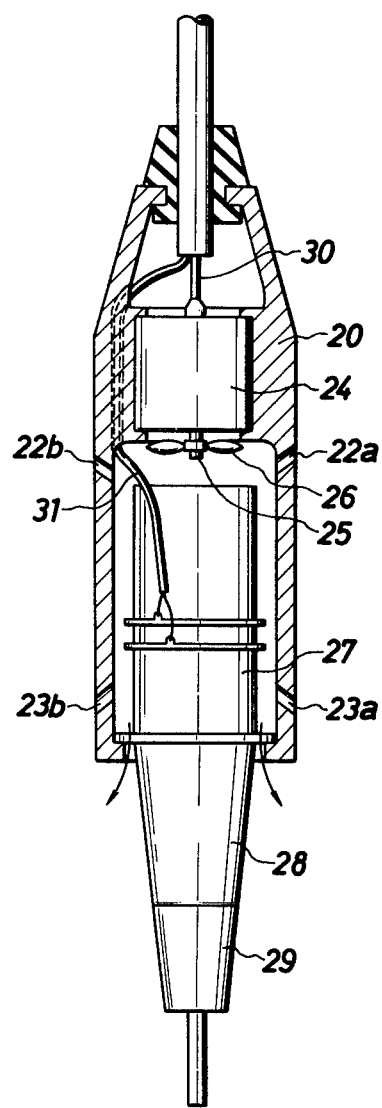

In accordance with the present invention, problems due to the above defects are reduced by means of a structure shown in FIG. 5.

Referring now to FIG. 5, there is shown components accommodated in a housing 20. In the housing 20 are formed air inlet bores 22a and 22b and air outlet bores 23a and 23b which pass through the outer peripheral wall of the cylinder portion of housing 20 and which incline slightly in the direction of air flow. Although four air bores are shown in FIG. 5, the number of the bores is increased and decreased according to necessity. A small-sized motor 24 is disposed in an upper portion in the housing 20 and a fan 26 is mounted on a forward end of a rotating shaft 25 of the motor. A vibrator 27 is accommodated in the housing 20 to connect entirely with a horn 28 by means of a screw rod or the like, the horn being extended under the outside of the housing 20. On a leading end of the horn 28 is disposed a tool such as a grindstone, cutter or the like. In FIG. 5, reference numerals 30 and 31 designate power cords for the motor 24 and the the vibrator 27, respectively.

In the ultrasonic machine tool having the above structure, because the fan 26 is rotated by driving the motor during working, a forced air cooling action is provided whereby air is drawn in through the air inlet bores 22a and 22b and is discharged forcedly from the air outlet bores 23a and 23b and through at the lower end of the housing. This air flow cools the vibvator 27. Thus, heat is not conducted to the tool 29. Accordingly, the structure has effects that the machine tool can increase the power by giving a large current to the vibrator 27 and at the same time can be suitable for long time use.

In the above mentioned embodiment, the invention has been described in relation to driving an ultrasonic vibrator. However, the invention is not limited only to the vibrator and for example, can be used as a power source of an induction furnace. That is, the induction furnace is constituted so that metal to be melted is put in the furnace with a wound induction coil which is passed through high frequency current and that the metal is melted by current generated with the induction effect in the metal. In this case, through the improvement of power-factor is accomplished by connecting a capacitor in parallel to the coil, because the inductance of the coil varies before and after melting of the metal it is difficult always to keep a high power-factor. In such a case, if means for detecting a varying inductance of the coil are provided and the varying quantity of the inductance is phase compared in phase relationship with the applied voltage, the furnace can be always operated at the optimum frequency of the coil.

The ultrasonic oscillator device according to the invention has further the following features.

Since the variable resistance characteristic of the FET is utilized for the variable gain amplification, the strain is small even if the variable gain amplifier is used.

The bias supplied to the gate of the FET, that is, the comparison with the reference voltage can be simply performed by the operational amplifier of the previous step.

Since the variable attenuation is performed by the resistance variation which occurs from the gate voltage of the FET, the control range can be widened according to selection of the resistance value and the strain can be reduced.

Since the circuit components can be easily fabricated as integrated circuits, the manufacture can be performed at low cost.

What is claimed is:

1. An ultrasonic oscillator device comprising
    an ultrasonic vibrator coupled to a load;
    means for coupling a driving voltage to said ultrasonic vibrator;
    means for detecting at least one electrical quantity indicating an operational condition of the load;
    a phase comparator for detecting a phase difference between said driving voltage and said at least one electrical quantity indicating an operational condition of the load;
    means for developing a direct current voltage corresponding to said detected phase difference;
    a voltage control oscillator means coupled to said developing means and having an oscillating frequency which is a function of said direct current voltage corresponding to said phase difference;
    means for comparing a reference value with a magnitude of said at least one electrical quantity indicating the operational condition of said load and for obtaining a difference signal therebetween; and
    a variable gain amplifier for amplifying the output of said voltage control oscillator means, said difference signal being coupled to said variable gain amplifier as the control signal of said variable gain amplifier to vary the gain thereof, said driving voltage coupling means being coupled to the output of said variable gain amplifier.

2. An ultrasonic device according to claim 1, wherein said variable gain amplifier comprises means for providing a variable resistance characteristic of a field effect transistor due to said variable gain.

3. An ultrasonic device according to claim 1 further comprising:
    a vibrator fixed in a housing and coupled as said load to said ultrasonic vibrator;
    a plurality of air bores formed in said housing;

a small-sized motor disposed above said vibrator in said housing; and a fan mounted on a rotating shaft of said motor.

4. An ultrasonic device according to claim 3 comprising a plurality of said bores above and below said vibrator; and passageway means in said housing extending between said bores above and below said vibrator and to said fan for cooling said vibrator by air flowing through said passageway and bores under the influence of said fan.

5. An ultrasonic device according to claim 1 further comprising:

a phase adjustor coupling at least one of said driving voltage and at least one electrical quantity to said phase comparator; and a zero point detector coupling at least one of said driving voltage and at least one electrical quantity to said phase comparator to convert a sinusoidal wave signal into a rectangular wave signal.

6. An ultrasonic device according to claim 5 wherein said phase adjustor couples said driving voltage to said phase comparator and said zero point detector couples said at least one electrical quantity to said phase comparator.

7. An ultrasonic oscillator device comprising an ultrasonic vibrator coupled to a load;

means for coupling a driving voltage to said ultrasonic vibrator;

means for detecting at least one electrical quantity indicating an operational condition of the load;

a phase comparator for detecting a phase difference between said driving voltage and said at least one electrical quantity indicating an operational condition of the load;

a phase adjustor coupling at least one of said driving voltage and at least one electrical quantity to said phase comparator;

a zero point detector coupling at least one of said driving voltage and at least one electrical quantity to said phase comparator to convert a sinusoidal wave signal into a rectangular wave signal;

means for developing a direct current voltage corresponding to said detected phase difference; and a voltage control oscillator means coupled to said developing means and having an oscillating frequency which is a function of said direct current voltage corresponding to said phase difference.

8. An ultrasonic device according to claim 7 wherein said phase adjustor couples said driving voltage to said phase comparator and said zero point detector couples said at least one electrical quantity to said phase comparator.

9. An ultrasonic device according to claims 7 or 8 further comprising:

a rectifying detector circuit coupled to receive said at least one electrical quantity for generating a rectified output;

means for comparing said rectified output of said detector circuit with a reference signal for generating a difference voltage; and means for applying said difference voltage to said variable gain amplifier as a control voltage to control the gain thereof;

said driving voltage coupling means being coupled to the output of said variable gain amplifier.

10. An ultrasonic device according to claim 9 wherein said applying means comprises a time constant circuit.

11. An ultrasonic oscillator device comprising an ultrasonic vibrator;

means for coupling a driving voltage to said ultrasonic vibrator;

a vibrator fixed in a housing and coupled to said ultrasonic vibrator as a load;

a plurality of air bores formed in said housing;

a small-sized motor disposed above said vibrator in said housing;

a fan mounted on a rotating shaft of said motor;

means for detecting at least one electrical quantity indicating an operational condition of said vibrator load;

a phase comparator for detecting a phase difference between said driving voltage and said at least one electrical quantity indicating an operational condition of said vibrator load;

means for developing a direct current voltage corresponding to said detected phase difference; and a voltage control oscillator means coupled to said developing means and having an oscillating frequency which is a function of said direct current voltage corresponding to said phase difference.

12. An ultrasonic device according to claim 11 comprising a plurality of said bores above and below said vibrator; and passageway means in said housing extending between said bores above and below said vibrator and to said fan for cooling said vibrator by air flowing through said passageway and bores under the influence of said fan.

13. An ultrasonic device according to claim 11 further comprising:

a phase adjustor coupling at least one of said driving voltage and at least one electrical quantity to said phase comparator; and a zero point detector coupling at least one of said driving voltage and at least one electrical quantity to said phase comparator to convert a sinusoidal wave signal into a rectangular wave signal.

14. An ultrasonic device according to claim 13 wherein said phase adjustor couples said driving voltage to said phase comparator and said zero point detector couples said at least one electrical quantity to said phase comparator.

* * * * *